United States Patent
Kim et al.

(10) Patent No.: US 9,128,817 B2
(45) Date of Patent: Sep. 8, 2015

(54) ADDRESS TRANSFORMING CIRCUIT AND SEMICONDUCTOR MEMORY DEVICE INCLUDING THE SAME

(75) Inventors: Seok-Il Kim, Hwaseong-si (KR);
You-Keun Han, Yongin-si (KR);
Sung-Ho Choi, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 835 days.

(21) Appl. No.: 13/343,803

(22) Filed: Jan. 5, 2012

(65) Prior Publication Data
US 2012/0239903 A1  Sep. 20, 2012

(30) Foreign Application Priority Data

Mar. 17, 2011  (KR) .................. 10-2011-0024046

(51) Int. Cl.
| G11C 8/04 | (2006.01) |
| G06F 12/02 | (2006.01) |
| G11C 8/06 | (2006.01) |

(52) U.S. Cl.
CPC .............. G06F 12/0207 (2013.01); G11C 8/04 (2013.01); G11C 8/06 (2013.01)

(58) Field of Classification Search
CPC .. G11C 16/08; G11C 13/0023; G11C 11/418; G11C 11/415; G11C 11/408; G11C 11/4087; G11C 11/4082; G11C 11/2253; G11C 11/1653; G11C 8/00; G11C 8/04; G11C 8/06; G11C 8/16; G11C 8/18
USPC .......... 365/230.08, 230, 230.09, 233.1, 236; 711/E12.001
See application file for complete search history.

(56) References Cited

U.S. PATENT DOCUMENTS

| 4,446,530 | A | * | 5/1984 | Tsuboka | 708/400 |
| 5,111,194 | A | * | 5/1992 | Oneda | 345/690 |
| 5,831,930 | A | * | 11/1998 | Hotta | 365/233.5 |
| 5,854,769 | A | * | 12/1998 | Lee | 365/230.02 |
| 7,319,634 | B2 | | 1/2008 | Choo et al. | |
| 2003/0053365 | A1 | * | 3/2003 | Kim | 365/233 |
| 2007/0033339 | A1 | * | 2/2007 | Best et al. | 711/106 |
| 2007/0153619 | A1 | | 7/2007 | Choo et al. | |
| 2009/0137070 | A1 | * | 5/2009 | Co et al. | 438/17 |
| 2013/0094320 | A1 | * | 4/2013 | Yoo et al. | 365/230.06 |

FOREIGN PATENT DOCUMENTS

| JP | 09293386 | 11/1997 |
| JP | 2007184072 | 7/2007 |
| JP | 2008287803 | 11/2008 |
| KR | 100735024 | 6/2007 |

* cited by examiner

*Primary Examiner* — Vanthu Nguyen
*Assistant Examiner* — Khamdan Alrobaie
(74) *Attorney, Agent, or Firm* — Onello & Mello, LLP (57) ABSTRACT

An address transforming circuit that can change a memory mapping when a system is booted includes a switch control signal generating circuit and an address transforming unit. The switch control signal generating circuit generates alternately enabled switch control signals synchronized with a reset signal. The address transforming unit transforms bits of a first address to generate a second address in response to the switch control signals. Accordingly, a semiconductor memory device including the address transforming circuit has a long lifetime and high reliability.

12 Claims, 6 Drawing Sheets

ADDRESS TRANSFORMING CIRCUIT AND SEMICONDUCTOR MEMORY DEVICE INCLUDING THE SAME

CROSS-REFERENCE TO RELATED APPLICATION

This application claims priority under 35 U.S.C. §119 to Korean Patent Application No. 10-2011-0024046 filed on Mar. 17, 2011 in the Korean Intellectual Property Office, the entire contents of which are incorporated herein by reference.

BACKGROUND

1. Field

Embodiments of the inventive concepts relate to a circuit and a method of transforming addresses in a semiconductor memory device.

2. Description of Related Art

In systems that employ a semiconductor memory device, certain regions of a memory cell array may be more active than other regions of the memory cell array. Regions that are used more frequently may have a shorter lifetime and lower reliability than the regions used less frequently.

SUMMARY

Embodiments of the inventive concepts provide an address transforming circuit that may change memory mapping when a system is booted.

Embodiments of the inventive concepts also provide a semiconductor memory device including the address transforming circuit.

Embodiments of the inventive concepts also provide a memory module including the address transforming circuit.

The technical objectives of the inventive concepts are not limited to those described herein.

In accordance with an aspect of the inventive concepts, an address transforming circuit includes a switch control signal generating circuit and an address transforming unit.

The switch control signal generating circuit may be configured to generate alternately enabled switch control signals that are synchronized with a reset signal. The address transforming unit may be configured to transform bits of a first address to generate a second address in response to the switch control signals.

In some embodiments, the transforming circuit may be configured to perform address mapping whenever a system is booted.

In some embodiments, an order in which the switch control signals are enabled may be determined based on a mapping counter value which is stored in a serial presence detect (SPD) of a memory module.

In some embodiments, the address transforming unit may include buffers and switches. The buffers are configured to buffer each of the bits of the first address and the switches are configured to perform address transforming on the buffered bits of the first address to generate the second address in response to the switch control signals.

In some embodiments, the switch control signals may be configured to be sequentially generated in response to a rising edge of the reset signal.

In some embodiments, the switch control signals may include a first switch control signal configured to be enabled in response to the reset signal, a second switch control signal configured to be enabled in response to a falling edge of the first switch control signal, and a third switch control signal configured to be enabled in response to a falling edge of the second switch control signal.

In some embodiments, the switch control signals may include a first switch control signal, a second switch control signal and a third switch control signal.

The first switch control signal may be configured to have a first rising edge that is synchronized with a first rising edge of the reset signal, and has a first falling edge that is synchronized with a second rising edge of the reset signal. The second switch control signal may be configured to have a first rising edge that is synchronized with the first falling edge of the first switch control signal, and has a first falling edge that is synchronized with a third rising edge of the reset signal. The third switch control signal may be configured to have a first rising edge that is synchronized with the first falling edge of the second switch control signal, and has a first falling edge that is synchronized with a fourth rising edge of the reset signal.

In some embodiments, the address transforming unit may include a first transforming circuit, a second transforming circuit and a third transforming circuit.

The first transforming circuit may be configured to buffer each of the bits of the first address, and perform address transforming with respect to buffered bits of the first address to generate a first bit of the second address in response to the switch control signals. The second transforming circuit may be configured to buffer each of the bits of the first address, and perform address transforming with respect to buffered bits of the first address to generate a second bit of the second address in response to the switch control signals. The third transforming circuit may be configured to buffer each of the bits of the first address, and perform address transforming with respect to buffered bits of the first address to generate a third bit of the second address in response to the switch control signals.

In some embodiments, the first transforming circuit may include a first buffer, a first switch, a second buffer, a second switch, a third buffer and a third switch.

The first buffer may be configured to buffer a first bit of the first address. The first switch may be configured to output the buffered first bit of the first address as the first bit of the second address in response to the first switch control signal. The second buffer may be configured to buffer a second bit of the first address. The second switch may be configured to output the buffered second bit of the first address as the first bit of the second address in response to the second switch control signal. The third buffer may be configured to buffer a third bit of the first address. The third switch may be configured to output the buffered third bit of the first address as the first bit of the second address in response to the third switch control signal.

In some embodiments, the second transforming circuit may include a first buffer, a first switch, a second buffer, a second switch, a third buffer and a third switch.

The first buffer may be configured to buffer a first bit of the first address. The first switch may be configured to output the buffered first bit of the first address as the second bit of the second address in response to the second switch control signal. The second buffer may be configured to buffer a second bit of the first address. The second switch may be configured to output the buffered second bit of the first address as the second bit of the second address in response to the third switch control signal. The third buffer may be configured to buffer a third bit of the first address. The third switch may be configured to output the buffered third bit of the first address as the second bit of the second address in response to the first switch control signal.

In some embodiments, the third transforming circuit may include a first buffer, a first switch, a second buffer, a second switch, a third buffer and a third switch.

The first buffer may be configured to buffer a first bit of the first address. The first switch may be configured to output the buffered first bit of the first address as the third bit of the second address in response to the third switch control signal. The second buffer may be configured to buffer a second bit of the first address. The second switch may be configured to output the buffered second bit of the first address as the third bit of the second address in response to the first switch control signal. The third buffer may be configured to buffer a third bit of the first address. The third switch may be configured to output the buffered third bit of the first address as the third bit of the second address in response to the second switch control signal.

In some embodiments, the first transforming circuit may include a first buffer, a first switch, a second buffer, a second switch, a third buffer, a third switch and a flip-flop.

The first buffer may be configured to buffer a first bit of the first address. The first switch may be configured to output the buffered first bit of the first address as the first bit of the second address in response to the first switch control signal. The second buffer may be configured to buffer a second bit of the first address. The second switch may be configured to output the buffered second bit of the first address as the first bit of the second address in response to the second switch control signal. The third buffer may be configured to buffer a third bit of the first address. The third switch may be configured to output the buffered third bit of the first address as the first bit of the second address in response to the third switch control signal. The flip-flop may be configured to latch output signals of the first switch, the second switch and the third switch, and generate the first bit of the second address in response to a clock signal.

In some embodiments, the second transforming circuit may include a first buffer, a first switch, a second buffer, a second switch, a third buffer, a third switch and a flip-flop.

The first buffer may be configured to buffer a first bit of the first address. The first switch may be configured to output the buffered first bit of the first address as the second bit of the second address in response to the second switch control signal. The second buffer may be configured to buffer a second bit of the first address. The second switch may be configured to output the buffered second bit of the first address as the second bit of the second address in response to the third switch control signal. The third buffer may be configured to buffer a third bit of the first address. The third switch may be configured to output the buffered third bit of the first address as the second bit of the second address in response to the first switch control signal. The flip-flop may be configured to latch output signals of the first switch, the second switch and the third switch, and generate the second bit of the second address in response to a clock signal.

In some embodiments, the third transforming circuit may include a first buffer, a first switch, a second buffer, a second switch, a third buffer, a third switch and a flip-flop.

The first buffer may be configured to buffer a first bit of the first address. The first switch may be configured to output the buffered first bit of the first address as the third bit of the second address in response to the third switch control signal. The second buffer may be configured to buffer a second bit of the first address. The second switch may be configured to output the buffered second bit of the first address as the third bit of the second address in response to the first switch control signal. The third buffer may be configured to buffer a third bit of the first address. The third switch may be configured to output the buffered third bit of the first address as the third bit of the second address in response to the second switch control signal. The flip-flop may be configured to latch output signals of the first switch, the second switch and the third switch, and generate the third bit of the second address in response to a clock signal.

In accordance with another aspect of the inventive concepts, a semiconductor memory device includes a memory cell array, an address transforming circuit, a row decoder and a column decoder.

The address transforming circuit may be configured to generate alternately enabled switch control signals synchronized with a reset signal, and transform bits of a first address to generate a transformed row address and a transformed column address in response to the switch control signals. The row decoder may be configured to decode the transformed row address and select a specified row of the memory cell array based on the decoded row address. The column decoder may be configured to decode the transformed column address and select a specified column of the memory cell array based on the decoded column address.

In some embodiments, the row decoder may not be reset when a system is booted.

In accordance with another aspect of the inventive concepts an address transforming circuit includes a switch control signal generating circuit configured to generate switch control signals in response to a reset signal and an address mapping counter value. The address transforming circuit may further include an address transforming unit configured to transform bits of a first address to generate a second address in response to the switch control signals.

In some embodiments, the address transforming circuit is configured to perform address mapping whenever a system is booted.

In some embodiments, the switch control signals are alternately enabled synchronized with the reset signal and wherein an order in which the switch control signals are enabled is determined based on the mapping counter value, the mapping counter value being stored in an SPD of a memory module.

In some embodiments, the switch control signals are configured to be sequentially generated in response to a rising edge of the reset signal.

In some embodiments, the address transforming unit may include buffers and switches. The buffers are configured to buffer each of the bits of the first address and the switches are configured to perform address transforming on the buffered bits of the first address to generate the second address in response to the switch control signals.

The address transforming circuit according to example embodiments of the inventive concepts generates switch control signals based on a reset signal and an address mapping counter, and changes addresses based on the switch control signals. Therefore, the semiconductor memory device including the address transforming circuit according to example embodiments of the inventive concept may change a memory mapping and may evenly access whole area of a memory cell array. Accordingly, the semiconductor memory device including the address transforming circuit may offer a long lifetime and high reliability.

BRIEF DESCRIPTION OF THE DRAWINGS

The foregoing and other features and advantages of the inventive concepts will be apparent from the detailed description of preferred embodiments of the inventive concepts, as illustrated in the accompanying drawings, in which like ref

DETAILED DESCRIPTION OF THE EMBODIMENTS

Various example embodiments will be described more fully hereinafter with reference to the accompanying drawings, in which some example embodiments are shown. These inventive concepts may, however, be embodied in different forms and should not be construed as limited to the embodiments set forth herein.

It will be understood that when an element or layer is referred to as being "on," "connected to" or "coupled with" another element or layer, it can be directly on, connected to or coupled with the other element or layer or intervening elements or layers may be present. In contrast, when an element is referred to as being "directly on," "directly connected to" or "directly coupled with" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the inventive concepts.

The terminology used herein is for the purpose of describing particular embodiments only and is not intended to be limiting of the inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Figure 1:
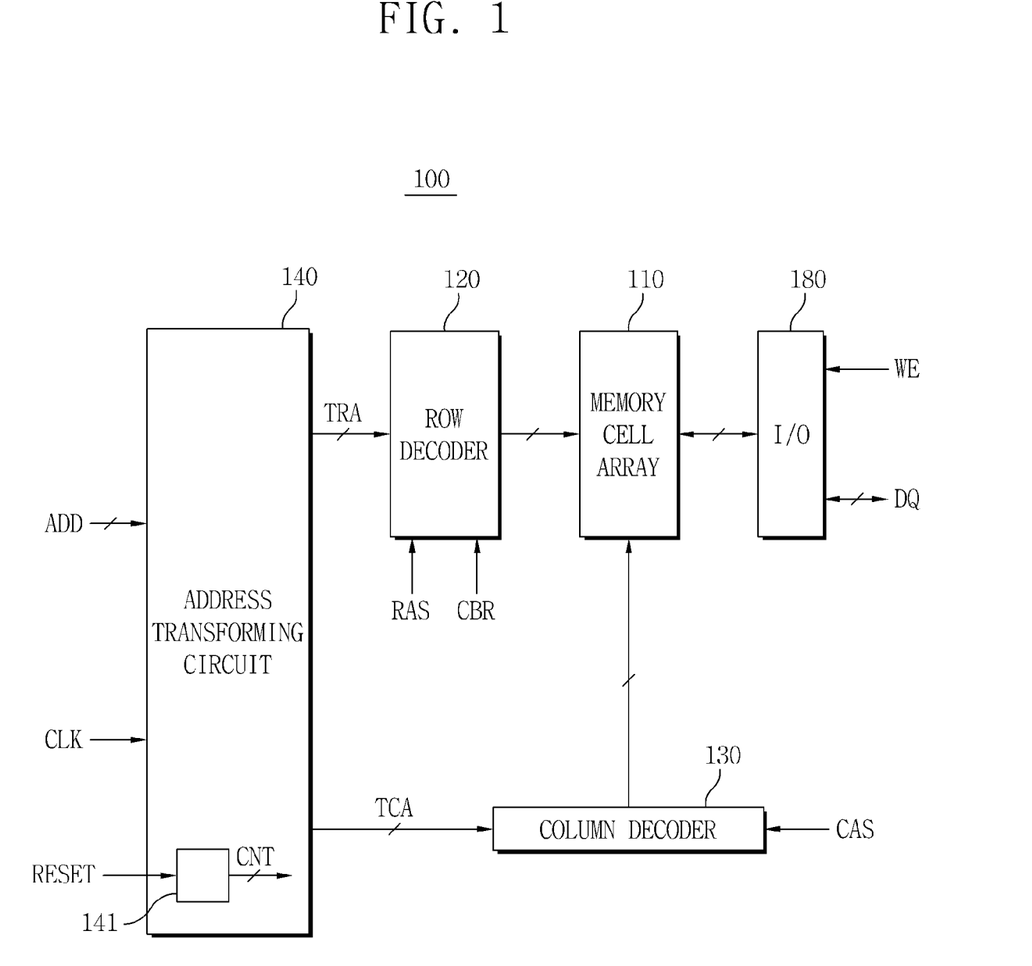
- FIG. 1 is a schematic block diagram of a semiconductor memory device according to an example embodiment of the inventive concepts.

FIG. 1 is a schematic block diagram of a semiconductor memory device 100 according to an example embodiment of the inventive concepts.

Referring to FIG. 1, the semiconductor memory device 100 includes a memory cell array 110, a row decoder 120, a column decoder 130, an address transforming circuit 140 and an input/output (I/O) circuit 180. The address transforming circuit 140 may include a switch control signal generating circuit 141.

The address transforming circuit 140 generates alternately enabled switch control signals CNT synchronized with a reset signal RESET, and transforms bits of a first address ADD to generate a transformed row address TRA and a transformed column address TCA in response to the switch control signals CNT. The address transforming circuit 140 may transform bits of the first address ADD to generate the transformed row address TRA and the transformed column address TCA in response to the switch control signals CNT and a clock signal CLK. The row decoder 120 decodes the transformed row address TRA and selects a specified row of the memory cell array 110 based on the decoded row address. The row decoder 120 may be controlled in response to a row address strobe signal RAS and column address strobe CAS before RAS signal (CBR). The column decoder 130 decodes the transformed column address TCA and selects a specified column of the memory cell array 110 based on the decoded column address. The column decoder 130 may be controlled in response to a column address strobe signal CAS. The I/O circuit 180 inputs data DQ to a memory cell that is selected by the row decoder 120 and the column decoder 130, or outputs data DQ from a memory cell that is selected by the row decoder 120 and the column decoder 130. The I/O circuit 180 receives a write enable signal (WE).

The address transforming circuit 140 according to an example embodiment of the inventive concepts may generate the switch control signals CNT based on the reset signal RESET and an address mapping counter value, and transform an address based on the switch control signals CNT.

Figure 2:
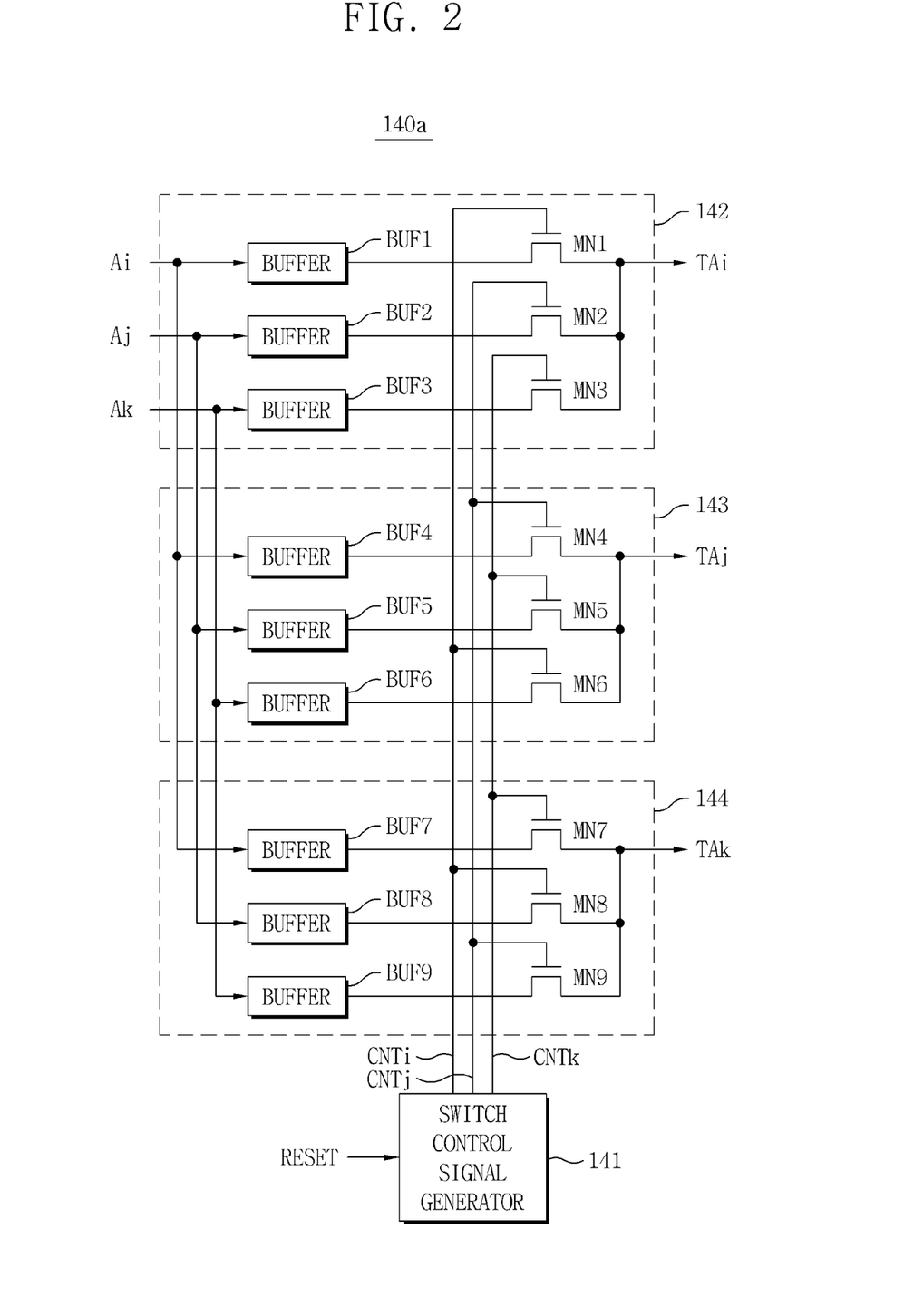
FIG. 2 is a schematic circuit diagram illustrating an example embodiment of an address transforming circuit included in the semiconductor memory device of FIG. 1.

FIG. 2 is a schematic circuit diagram illustrating an example embodiment of an address transforming circuit 140*a* included in the semiconductor memory device 100 of FIG. 1.

Referring to FIG. 2, the address transforming circuit 140*a* includes a switch control signal generating circuit 141 and an address transforming unit. The address transforming unit may include a first transforming circuit 142, a second transforming circuit 143 and a third transforming circuit 144.

The switch control signal generating circuit 141 generates alternately enabled switch control signals CNTi, CNTj and CNTk that are synchronized with a reset signal RESET. The address transforming unit transforms bits Ai, Aj and Ak of a first address ADD to generate a second address having bits TAi, TAj and TAk in response to the switch control signals CNTi, CNTj and CNTk.

The first transforming circuit 142 buffers each of the bits Ai, Aj and Ak of the first address ADD, and performs address transforming with respect to buffered bits of the first address ADD to generate a first bit TAi of the second address in response to the switch control signals CNTi, CNTj and CNTk. The second transforming circuit buffers each of the bits Ai, Aj and Ak of the first address ADD, and performs address transforming with respect to buffered bits of the first address ADD to generate a second bit TAj of the second address in response to the switch control signals CNTi, CNTj and CNTk. The third transforming circuit buffers each of the bits Ai, Aj and Ak of the first address ADD, and performs address transforming with respect to buffered bits of the first address ADD to generate a third bit TAk of the second address in response to the switch control signals CNTi, CNTj and CNTk.

The first transforming circuit 142 may include a first buffer BUF1, a first NMOS transistor MN1, a second buffer BUF2, a second NMOS transistor MN2, a third buffer BUF3 and a third NMOS transistor MN3.

The first buffer BUF1 buffers a first bit Ai of the first address ADD. The first NMOS transistor MN1 outputs the buffered first bit of the first address ADD as the first bit TAi of the second address in response to the first switch control signal CNTi. The second buffer BUF2 buffers a second bit Aj of the first address ADD. The second NMOS transistor MN2 outputs the buffered second bit of the first address ADD as the first bit TAi of the second address in response to the second switch control signal CNTj. The third buffer BUF3 buffers a third bit Ak of the first address ADD. The third NMOS transistor MN3 outputs the buffered third bit of the first address ADD as the first bit TAi of the second address in response to the third switch control signal CNTk.

The second transforming circuit 143 may include a fourth buffer BUF4, a fourth NMOS transistor MN4, a fifth buffer BUF5, a fifth NMOS transistor MN5, a sixth buffer BUF6 and a sixth NMOS transistor MN6.

The fourth buffer BUF4 buffers a first bit Ai of the first address ADD. The fourth NMOS transistor MN4 outputs the buffered first bit of the first address ADD as the second bit TAj of the second address in response to the second switch control signal CNTj. The fifth buffer BUF5 buffers a second bit Aj of the first address ADD. The fifth NMOS transistor MN5 outputs the buffered second bit of the first address ADD as the second bit TAj of the second address in response to the third switch control signal CNTk. The sixth buffer BUF6 buffers a third bit Ak of the first address ADD. The sixth NMOS transistor MN6 outputs the buffered third bit of the first address ADD as the second bit TAj of the second address in response to the first switch control signal CNTi.

The third transforming circuit 144 may include a seventh buffer BUF7, a seventh NMOS transistor MN7, an eighth buffer BUF8, an eighth NMOS transistor MN8, a ninth buffer BUF9 and a ninth NMOS transistor MN9.

The seventh buffer BUF7 buffers a first bit Ai of the first address ADD. The seventh NMOS transistor MN7 outputs the buffered first bit of the first address ADD as the third bit TAk of the second address in response to the third switch control signal CNTK. The eighth buffer BUF8 buffers a second bit Aj of the first address ADD. The eighth NMOS transistor MN8 outputs the buffered second bit of the first address ADD as the third bit TAk of the second address in response to the first switch control signal CNTi. The ninth buffer BUF9 buffers a third bit Ak of the first address ADD. The ninth NMOS transistor MN9 outputs the buffered third bit of the first address ADD as the third bit TAk of the second address in response to the second switch control signal CNTj.

The transforming circuit 140a shown in FIG. 2 outputs signals of the NMOS transistors MN1-MN9, that operate as switches, as bits of the second address in response to the switch control signals CNTi, CNTj and CNTk.

Figure 3:
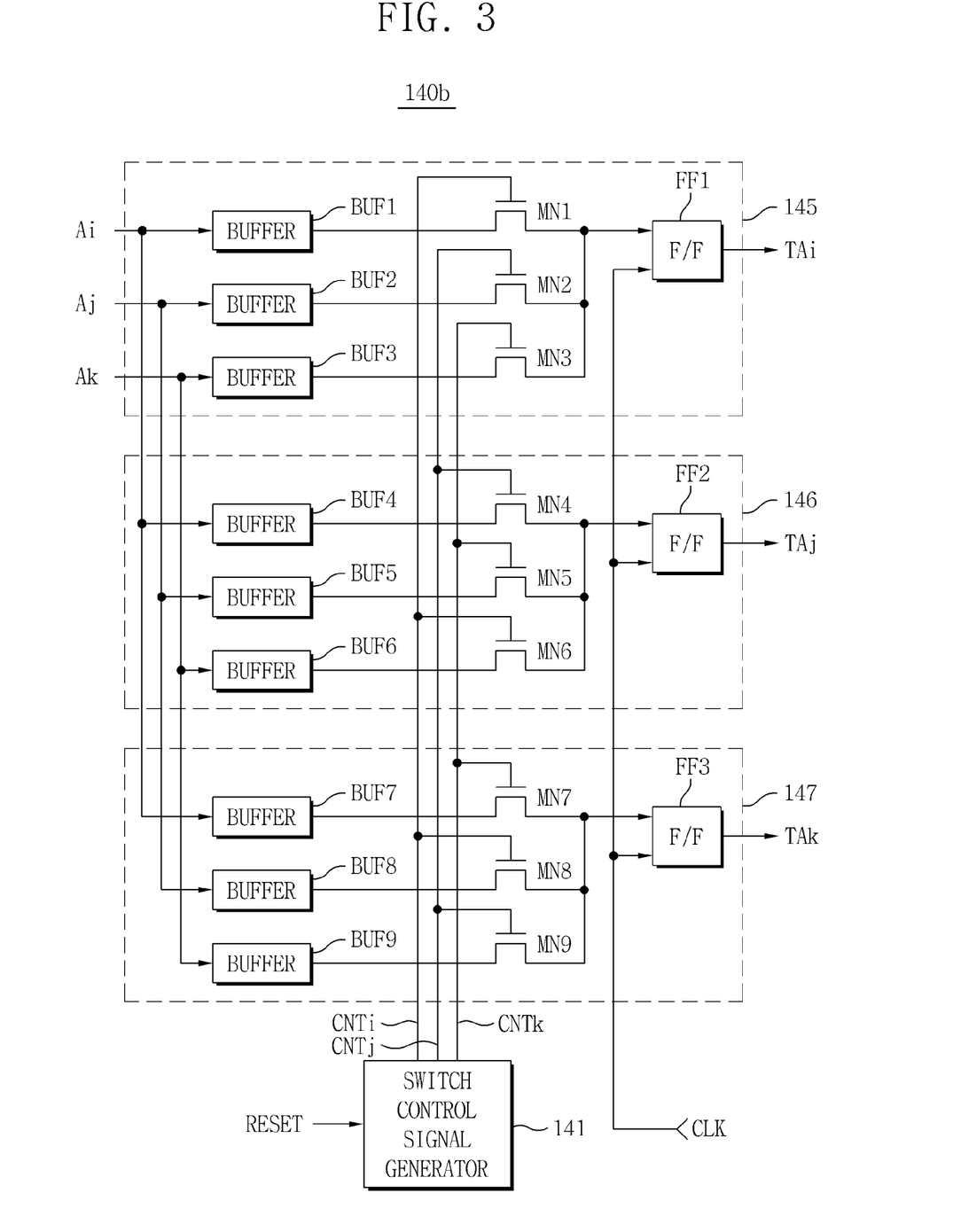
FIG. 3 is a schematic circuit diagram illustrating another example embodiment of an address transforming circuit included in the semiconductor memory device of FIG. 1.

FIG. 3 is a schematic circuit diagram illustrating another example embodiment of an address transforming circuit 140b included in the semiconductor memory device 100 of FIG. 1.

Referring to FIG. 3, the address transforming circuit 140b includes a switch control signal generating circuit 141 and an address transforming unit. The address transforming unit may include a fourth transforming circuit 145, a fifth transforming circuit 146 and a sixth transforming circuit 147.

The switch control signal generating circuit 141 generates alternately enabled switch control signals CNTi, CNTj and CNTk synchronized with a reset signal RESET. The address transforming unit transforms bits Ai, Aj and Ak of a first address ADD to generate a second address having bits TAi, TAj and TAk in response to the switch control signals CNTi, CNTj and CNTk.

The fourth transforming circuit 145 may include a first buffer BUF1, a first NMOS transistor MN1, a second buffer BUF2, a second NMOS transistor MN2, a third buffer BUF3, a third NMOS transistor MN3 and a first flip-flop FF1.

The first buffer BUF1 buffers a first bit Ai of the first address ADD. The first NMOS transistor MN1 outputs the buffered first bit of the first address ADD as the first bit TAi of the second address in response to the first switch control signal CNTi. The second buffer BUF2 buffers a second bit Aj of the first address ADD. The second NMOS transistor MN2 outputs the buffered second bit of the first address ADD as the first bit TAi of the second address in response to the second switch control signal CNTj. The third buffer BUF3 buffers a third bit Ak of the first address ADD. The third NMOS transistor MN3 outputs the buffered third bit of the first address ADD in response to the third switch control signal CNTk. The first flip-flop FF1 latches output signals of the first NMOS transistor MN1, the second NMOS transistor MN2, and the third NMOS transistor MN3, and generates the first bit TAi of the second address in response to a clock signal CLK.

The fifth transforming circuit 146 may include a fourth buffer BUF4, a fourth NMOS transistor MN4, a fifth buffer BUF5, a fifth NMOS transistor MN5, a sixth buffer BUF6, a sixth NMOS transistor MN6 and a second flip-flop FF2.

The fourth buffer BUF4 buffers a first bit Ai of the first address ADD. The fourth NMOS transistor MN4 outputs the buffered first bit of the first address ADD as the second bit TAj of the second address in response to the second switch control signal CNTj. The fifth buffer BUF5 buffers a second bit Aj of the first address ADD. The fifth NMOS transistor MN5 outputs the buffered second bit of the first address ADD as the second bit TAj of the second address in response to the third switch control signal CNTk. The sixth buffer BUF6 buffers a third bit Ak of the first address ADD. The sixth NMOS transistor MN6 outputs the buffered third bit of the first address ADD in response to the first switch control signal CNTi. The second flip-flop FF2 latches output signals of the fourth NMOS transistor MN4, the fifth NMOS transistor MN5, and the sixth NMOS transistor MN6, and generates the second bit TAj of the second address in response to the clock signal CLK.

The sixth transforming circuit 147 may include a seventh buffer BUF7, a seventh NMOS transistor MN7, an eighth buffer BUF8, an eighth NMOS transistor MN8, a ninth buffer BUF9, a ninth NMOS transistor MN9 and a third flip-flop FF3.

The seventh buffer BUF7 buffers a first bit Ai of the first address ADD. The seventh NMOS transistor MN7 outputs the buffered first bit of the first address ADD as the third bit TAk of the second address in response to the third switch control signal CNTK. The eighth buffer BUF8 buffers a second bit Aj of the first address ADD. The eighth NMOS transistor MN8 outputs the buffered second bit of the first address ADD as the third bit TAk of the second address in response to the first switch control signal CNTi. The ninth buffer BUF9 buffers a third bit Ak of the first address ADD. The ninth NMOS transistor MN9 outputs the buffered third bit of the first address ADD in response to the second switch control signal CNTj. The third flip-flop FF3 latches output signals of the seventh NMOS transistor MN7, the eighth NMOS transistor MN8, and the ninth NMOS transistor MN9, and generates the third bit TAk of the second address in response to the clock signal CLK.

In the example embodiments of the address mapping of the transforming circuit shown in FIGS. 2 and 3, when the first switch control signal CNTi is enabled, the first bit Ai of the first address ADD is output as the first bit TAi of the second address, the third bit Ak of the first address ADD is output as the second bit TAj of the second address, and the second bit Aj of the first address ADD is output as the third bit TAk of the second address.

When the second switch control signal CNTj is enabled, the second bit Aj of the first address ADD is output as the first bit TAi of the second address, the first bit Ai of the first address ADD is output as the second bit TAj of the second address, and the third bit Ak of the first address ADD is output as the third bit TAk of the second address.

When the third switch control signal CNTk is enabled, the third bit Ak of the first address ADD is output as the first bit TAi of the second address, the second bit Aj of the first address ADD is output as the second bit TAj of the second address, and the first bit Ai of the first address ADD is output as the third bit TAk of the second address.

The transforming circuit 140b shown in FIG. 3 latches output signals of the NMOS transistors MN1-MN9 that operate as switches and outputs the latched output signals as bits of the second address using flip-flops FF1-FF3.

Figure 4:
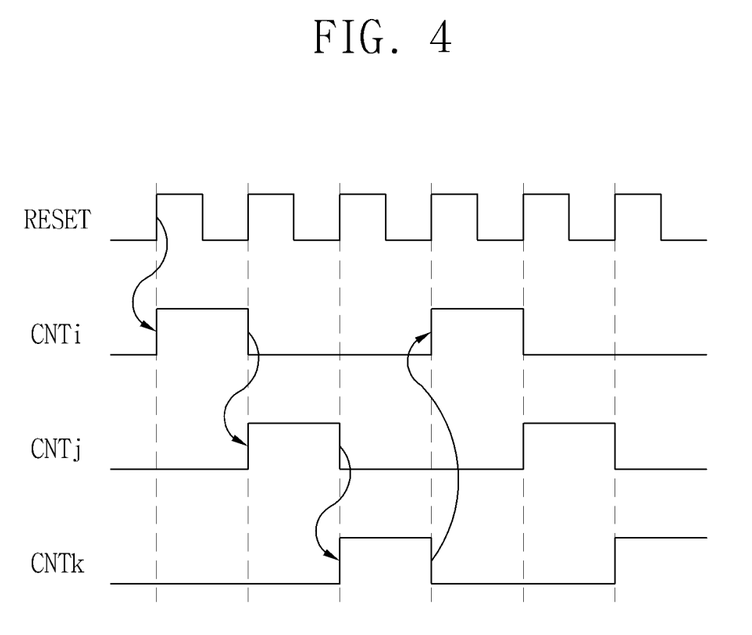
FIG. 4 is a timing diagram illustrating switch control signals used in the address transforming circuits shown in FIG. 2 and FIG. 3 according to an example embodiment of the inventive concepts.

FIG. 4 is a timing diagram illustrating switch control signals used in the address transforming circuits shown in FIG. 2 and FIG. 3 in accordance with an example embodiment of the inventive concepts.

The switch control signals may include a first switch control signal CNTi, a second switch control signal CNTj, and a third switch control signal CNTk. Referring to FIG. 4, the switch control signals CNTi, CNTj and CNTk may be sequentially generated in response to a rising edge of the reset signal RESET. The switch control signals may include the first switch control signal CNTi that is enabled in response to the reset signal RESET, the second switch control signal CNTj that is enabled in response to a falling edge of the first switch control signal CNTi, and the third switch control signal CNTk that is enabled in response to a falling edge of the second switch control signal CNTj.

The first switch control signal CNTi has a first rising edge synchronized with a first rising edge of the reset signal RESET, and has a first falling edge synchronized with a second rising edge of the reset signal RESET. The second switch control signal CNTj has a first rising edge synchronized with the first falling edge of the first switch control signal CNTi, and has a first falling edge synchronized with a third rising edge of the reset signal RESET. The third switch control signal CNTk has a first rising edge synchronized with the first falling edge of the second switch control signal CNTj, and has a first falling edge synchronized with a fourth rising edge of the reset signal RESET.

Figure 5:
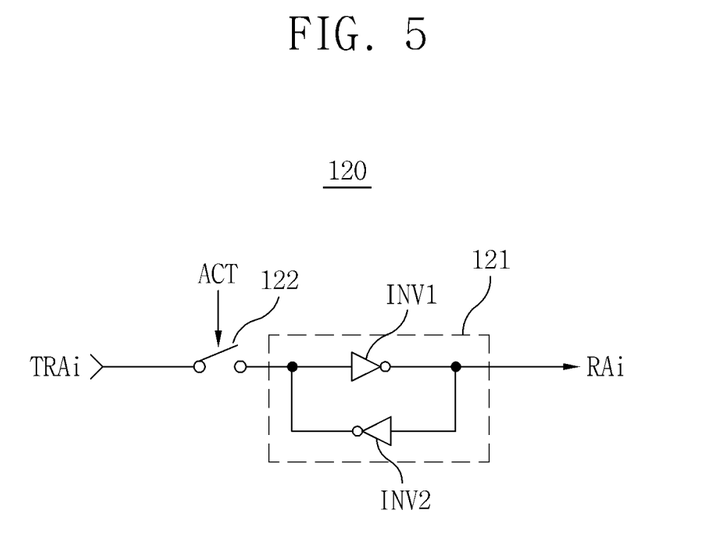
FIG. 5 is a schematic circuit diagram illustrating an example embodiment of a row decoder included in the semiconductor memory device of FIG. 1.

FIG. 5 is a schematic circuit diagram illustrating an example embodiment of a row decoder 120 included in the semiconductor memory device 100 of FIG. 1. In FIG. 5, a row decoder decoding one bit is shown for convenience of explanation; however, the inventive concepts are not limited thereto.

Referring to FIG. 5, the row decoder 120 may include a switch 122 operating in response to an active signal ACT and a latch 121 serially connected to the switch 122. The latch 121 may include inverters INV1 and INV2. In FIG. 5, the TRAi signal corresponds to the transformed row address signal TRA in FIG. 1, and the RAi signal corresponds to an output signal of the row decoder 120 of FIG. 1.

The semiconductor memory device including the row decoder 120 of FIG. 5 is not subjected to a reset when the system is booted, since a reset signal is not applied to the latch 121.

Hereinafter, the address transforming circuit 140 and a semiconductor memory device 100 including the address transforming circuit 140 according to example embodiments of the inventive concepts will be described.

Referring to FIG. 4, the switch control signals CNTi, CNTj and CNTk may be sequentially generated in response to a rising edge of the reset signal RESET. The first switch control signal CNTi may be enabled in response to the reset signal RESET, a second switch control signal CNTj may be enabled in response to a falling edge of the first switch control signal CNTi, and a third switch control signal CNTk may be enabled in response to a falling edge of the second switch control signal CNTj. That is, the switch control signals CNTi, CNTj and CNTk may be generated in a counter mode in which, when one switch control signal is disabled, another switch control signal is enabled. The order in which the switch control signals are enabled may be determined based on a mapping counter value which is stored in a serial presence detect SPD of a memory module. For example, the signal coming out first among the switch control signals CNTi, CNTj and CNTk may be determined based on a mapping counter value which is stored in an SPD of a memory module.

As shown in FIG. 5, the semiconductor memory device 100 including the address transforming circuit 140 according to example embodiments of the inventive concepts is not subjected to a reset when the system is booted, since a reset signal is not applied to the latch 121 included in the row decoder 120. Therefore, the semiconductor memory device 100 allows for a variation in memory mapping and, as a result, may use an entire area of a memory cell array as illustrated in FIGS. 2 and 3 in a generally evenly distributed manner. Accordingly, the semiconductor memory device including the address transforming circuit 140 according to example embodiments of the inventive concepts may offer greater longevity and high reliability.

Figure 6:
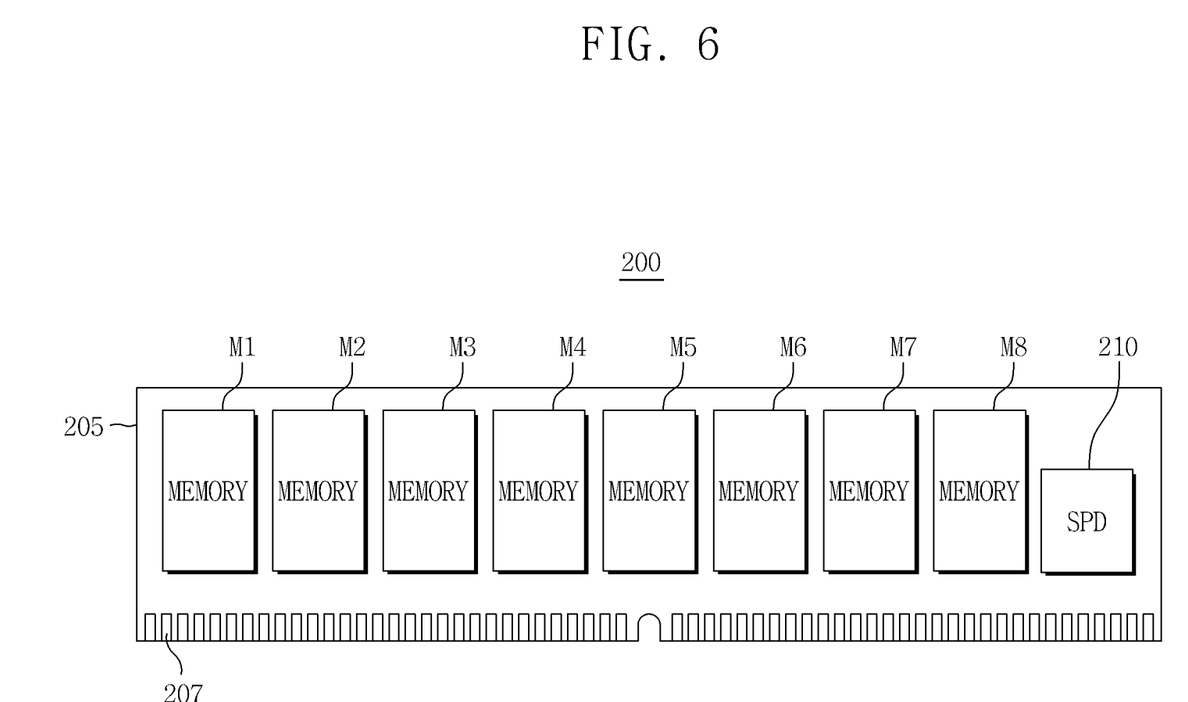
FIG. 6 is a schematic diagram illustrating an example embodiment of a memory module including a memory device according to example embodiments of the inventive concepts.

FIG. 6 is a schematic diagram illustrating an example embodiment of a memory module including a memory device according to example embodiments of the inventive concepts.

Referring to FIG. 6, the memory module 200 may include semiconductor memory devices M1 through M8, and an SPD 210 disposed on the printed circuit board (PCB) 205. In the plan view of FIG. 6, the eight semiconductor memory devices M1 through M8 are disposed on an upper side of the PCB 205, but the memory module 200 may have eight semiconductor memory devices disposed on a lower side of the PCB 205.

The semiconductor memory devices M1 through M8 may have a circuit structure according to example embodiments of the inventive concepts shown in FIG. 1. Information related to the memory module, for example, whether semiconductor memory devices are mounted or not, operating speed, and an address mapping counter value, may be stored in the SPD 210. The information present on the memory module 200 may be provided to a memory controller according to a request of the memory controller. In the SPD 210, address mapping information of last booting time may be included. The order that switch control signals used in an address transforming circuit included in each of the semiconductor memory devices M1 through M8 are enabled may be determined based on the mapping counter value stored in the SPD 210.

A plurality of module tabs 207 may function as a path which receives and transmits signals between the memory module 200 and external devices. In the memory module 200 of FIG. 6, buses for transmitting signals are not shown.

Figure 7:
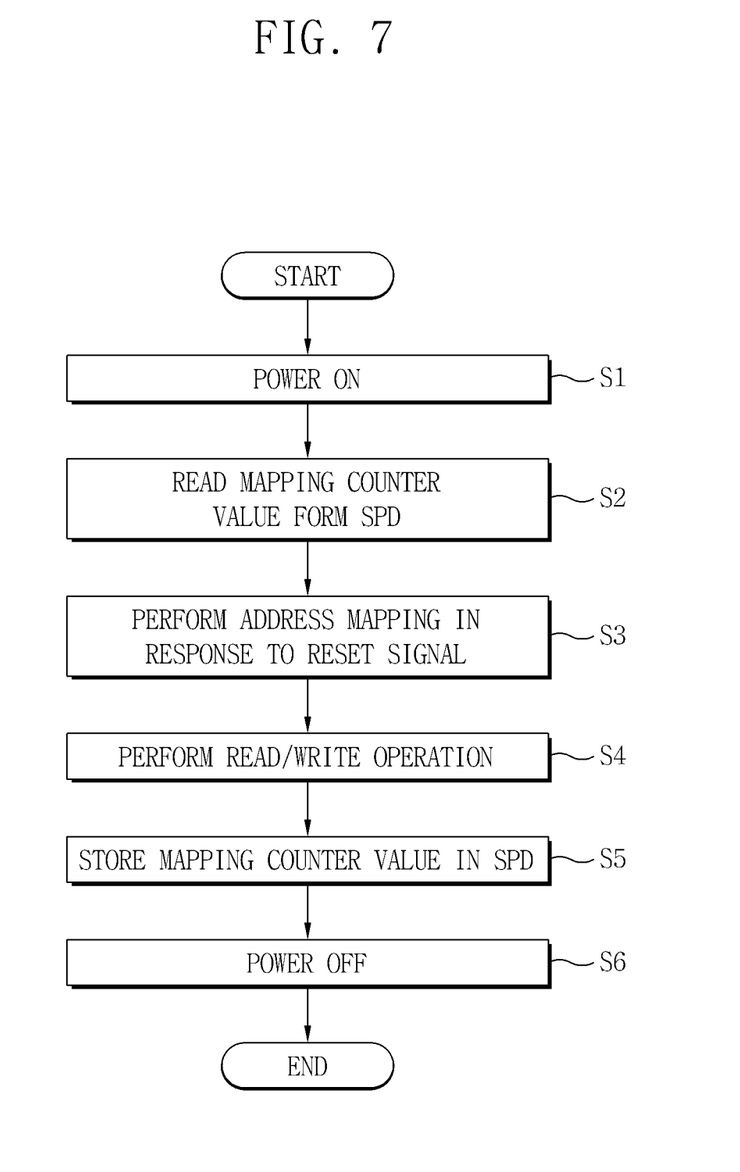
FIG. 7 is a flow chart illustrating operations of a semiconductor memory device according to example embodiments of the inventive concepts.

FIG. 7 is a flow chart illustrating operations of a semiconductor memory device according to example embodiments of the inventive concepts.

Referring to FIG. 7, semiconductor memory devices according to example embodiments of the inventive concepts may operate according to following steps:
(1) turn on the power (S1)
(2) read a mapping counter value from SPD (S2)
(3) perform address mapping in response to a reset signal (S3)
(4) perform read/write operation (S4)
(5) store the mapping counter value in SPD (S5)
(6) turn off the power (S6)

The address mapping in response to a reset signal in step S3 may include determining the order in which the switch control signals are enabled based on a mapping counter value stored in an SPD of a semiconductor memory module.

Example embodiments of the inventive concepts may be applied to a semiconductor memory device, and a memory module and memory system including the semiconductor memory device.

The foregoing is illustrative of embodiments and is not to be construed as limiting thereof. While the inventive concepts have been particularly shown and described with reference to exemplary embodiments thereof, it will be understood that various substitutions, modifications, and changes in form and details may be made therein without departing from the spirit and scope of the following claims. Accordingly, all such modifications are intended to be included within the scope of the inventive concepts as defined in the claims. In the claims, means-plus-function clauses are intended to cover the structures described herein as performing the recited function, and not only structural equivalents but also equivalent structures. Therefore, it is to be understood that the foregoing is illustrative of various embodiments and not to be construed as limiting of the inventive concepts to the specific embodiments disclosed, and that modifications to the disclosed embodiments, as well as other embodiments, are intended to be included within the scope of the appended claims.

What is claimed is:

1. An address transforming circuit, comprising:
a switch control signal generating circuit configured to generate alternately enabled switch control signals that are synchronized with a reset signal; and
an address transforming unit configured to transform bits of a first address to generate a second address in response to the switch control signals,
wherein the switch control signals include:
a first switch control signal configured to be enabled in response to the reset signal;
a second switch control signal configured to be enabled in response to a falling edge of the first switch control signal; and
a third switch control signal configured to be enabled in response to a falling edge of the second switch control signal.

2. The address transforming circuit of claim 1, wherein the address transforming circuit is configured to perform address mapping whenever a system is booted.

3. The address transforming circuit of claim 1, wherein an order in which the switch control signals are enabled is determined based on a mapping counter value, the mapping counter value being stored in an serial presence detect (SPD) of a memory module.

4. The address transforming circuit of claim 1, wherein the address transforming unit includes:
buffers that are configured to buffer each of the bits of the first address; and
switches that are configured to perform address transforming on the buffered bits of the first address to generate the second address in response to the switch control signals.

5. An address transforming circuit, comprising:
a switch control signal generating circuit configured to generate alternately enabled switch control signals that are synchronized with a reset signal; and
an address transforming unit configured to transform bits of a first address to generate a second address in response to the switch control signals,
wherein the switch control signals include:
a first switch control signal configured to have a first rising edge that is synchronized with a first rising edge of the reset signal, and have a first falling edge that is synchronized with a second rising edge of the reset signal;
a second switch control signal configured to have a first rising edge that is synchronized with the first falling edge of the first switch control signal, and have a first falling edge that is synchronized with a third rising edge of the reset signal; and
a third switch control signal configured to have a first rising edge that is synchronized with the first falling edge of the second switch control signal, and have a first falling edge that is synchronized with a fourth rising edge of the reset signal.

6. The address transforming circuit of claim 5, wherein the address transforming unit includes:
a first transforming circuit configured to buffer each of the bits of the first address, and perform address transforming with respect to buffered bits of the first address to generate a first bit of the second address in response to the switch control signals;
a second transforming circuit configured to buffer each of the bits of the first address, and perform address transforming with respect to buffered bits of the first address to generate a third bit of the second address in response to the switch control signals; and
a third transforming circuit configured to buffer each of the bits of the first address, and perform address transforming with respect to buffered bits of the first address to generate a third bit of the second address in response to the switch control signals.

7. The address transforming circuit of claim 6, wherein the first transforming circuit includes:
a first buffer configured to buffer a first bit of the first address;
a first switch configured to output the buffered first bit of the first address as the first bit of the second address in response to the first switch control signal;
a second buffer configured to buffer a second bit of the first address;
a second switch configured to output the buffered second bit of the first address as the first bit of the second address in response to the second switch control signal;

a third buffer configured to buffer a third bit of the first address; and a third switch configured to output the buffered third bit of the first address as the first bit of the second address in response to the third switch control signal.

8. The address transforming circuit of claim 6, wherein the second transforming circuit includes:

a first buffer configured to buffer a first bit of the first address;

a first switch configured to output the buffered first bit of the first address as the second bit of the second address in response to the second switch control signal;

a second buffer configured to buffer a second bit of the first address;

a second switch configured to output the buffered second bit of the first address as the second bit of the second address in response to the third switch control signal;

a third buffer configured to buffer a third bit of the first address; and a third switch configured to output the buffered third bit of the first address as the second bit of the second address in response to the first switch control signal.

9. The address transforming circuit of claim 6, wherein the third transforming circuit includes:

a first buffer configured to buffer a first bit of the first address;

a first switch configured to output the buffered first bit of the first address as the third bit of the second address in response to the third switch control signal;

a second buffer configured to buffer a second bit of the first address;

a second switch configured to output the buffered second bit of the first address as the third bit of the second address in response to the first switch control signal;

a third buffer configured to buffer a third bit of the first address; and a third switch configured to output the buffered third bit of the first address as the third bit of the second address in response to the second switch control signal.

10. The address transforming circuit of claim 6, wherein the first transforming circuit includes:

a first buffer configured to buffer a first bit of the first address;

a first switch configured to output the buffered first bit of the first address as the first bit of the second address in response to the first switch control signal;

a second buffer configured to buffer a second bit of the first address;

a second switch configured to output the buffered second bit of the first address as the first bit of the second address in response to the second switch control signal;

a third buffer configured to buffer a third bit of the first address;

a third switch configured to output the buffered third bit of the first address as the first bit of the second address in response to the third switch control signal; and a flip-flop configured to latch output signals of the first switch, the second switch and the third switch, and generate the first bit of the second address in response to a clock signal.

11. The address transforming circuit of claim 6, wherein the second transforming circuit includes:

a first buffer configured to buffer a first bit of the first address;

a first switch configured to output the buffered first bit of the first address as the second bit of the second address in response to the second switch control signal;

a second buffer configured to buffer a second bit of the first address;

a second switch configured to output the buffered second bit of the first address as the second bit of the second address in response to the third switch control signal;

a third buffer configured to buffer a third bit of the first address;

a third switch configured to output the buffered third bit of the first address as the second bit of the second address in response to the first switch control signal; and a flip-flop configured to latch output signals of the first switch, the second switch and the third switch, and generate the second bit of the second address in response to a clock signal.

12. The address transforming circuit of claim 6, wherein the third transforming circuit includes:

a first buffer configured to buffer a first bit of the first address;

a first switch configured to output the buffered first bit of the first address as the third bit of the second address in response to the third switch control signal;

a second buffer configured to buffer a second bit of the first address;

a second switch configured to output the buffered second bit of the first address as the third bit of the second address in response to the first switch control signal;

a third buffer configured to buffer a third bit of the first address;

a third switch configured to output the buffered third bit of the first address as the third bit of the second address in response to the second switch control signal; and a flip-flop configured to latch output signals of the first switch, the second switch and the third switch, and generate the third bit of the second address in response to a clock signal.

* * * * *